United States Patent [19]

Salama

[11] 4,201,622

[45] May 6, 1980

[54] METHOD OF MITIGATING TITANIUM IMPURITIES EFFECTS IN P-TYPE SILICON MATERIAL FOR SOLAR CELLS

[76] Inventor: Robert A. Frosch, Administrator of the National Aeronautics and Space Administration, with respect to an invention of Amal M. Salama, Los Angeles, Calif.

[21] Appl. No.: 8,212

[22] Filed: Jan. 31, 1979

[51] Int. Cl.$^2$ ............................................. B01J 17/34
[52] U.S. Cl. ........................... 156/605; 156/617 SP; 156/DIG. 64; 136/89 SG; 252/62.3 E
[58] Field of Search ......... 156/605, 617 SP, DIG. 64; 136/89 SG; 252/623 E

[56] References Cited

U.S. PATENT DOCUMENTS 4,124,410   11/1978   Kotval et al. .................. 136/89 TF

OTHER PUBLICATIONS

A. M. Salama, The Effects of Copper and Titanium of Silicon Solar Cells, Conference Record, 13th IEEE Photovoltaic Specialists Conference, pp. 496–502.
J. R. Davis et al., Characterization of the Effects of Metallic Impurities . . . , Conference Record, 13th IEEE Photovoltaic Specialists Conf., pp. 490–495.
J. R. Davis et al., Silicon Solar Cells From Transition Metal Doped . . . Crystals, Conference Record, 12th IEEE Photovoltaic Specialists Conf., pp. 106–111.
D. E. Hill et al., The Effect of Secondary Impurities on Solar Cell Performance, Conference Record, 12th IEEE Photovoltaic Specialists Conf., pp. 112–119.

*Primary Examiner*—John H. Mack
*Assistant Examiner*—William Leader
*Attorney, Agent, or Firm*—Monte F. Mott; John R. Manning; Wilfred Grifka

[57] ABSTRACT

Microstructural evaluation tests performed on Cu-doped, Ti-doped and Cu/Ti doped p-type silicon single crystal wafers, before and after the solar cell fabrication, and evaluation of both dark forward and reverse I-V characteristic records for the solar cells produced from the corresponding silicon wafers, show that Cu mitigates the unfavorable effects of Ti, and thus provides for higher conversion efficiency, thereby providing an economical way to reduce the deleterious effects of titanium, one of the impurities present in metallurgical grade silicon material.

2 Claims, 2 Drawing Figures

METHOD OF MITIGATING TITANIUM IMPURITIES EFFECTS IN P-TYPE SILICON MATERIAL FOR SOLAR CELLS

ORIGIN OF THE INVENTION

The invention described herein was made in the performance of work under a NASA contract and is subject to the provisions of Section 305 of the National Aeronautics and Space Act of 1958, Public Law 85-568 (Stat. 435, 42 USC 2457).

BACKGROUND OF THE INVENTION

This invention relates to a technique for reducing the deleterious effect of titanium impurities (commonly found in metallurgical grade silicon) on silicon solar cells. It resulted from a study to determine the effects of impurities present in metallurgical grade silicon of different concentration levels, on silicon material properties and solar cell performance in order to establish the definition of solar grade silicon.

Titanium is one of the impurities commonly found in metallurgical grade silicon with concentrations as high as $10^{15}$ atoms/cm$^3$. From previous investigations, it has been found that deliberately copper-doped N/P silicon solar cells produced from p-type material, where N is the phosphorous region and P is the boron region of the junction, and N/P copper/titanium-doped silicon solar cells from the same p-type material, have good electrical characteristics. However, the titanium-doped solar cells degraded the cell conversion efficiency to $\sim 61\%$ of the undoped (baseline) silicon solar cells. To understand this behavior, a series of microstructural evaluation tests were performed on silicon wafers and cells cut from the copper-doped, titanium-doped and copper/titanium-doped crystals of concentration level $10^{16}$, $10^{14}$ and $10^{15}/10^{15}$ atoms/cm$^3$ respectively.

The microstructural tests performed in this work, together with the dark I-V measurements have lead to defining the mechanism by which copper and titanium impurities and other induced crystallographic defects improve or degrade the solar cell performance.

The microstructural defects are correlated with the concentrations of the impurities, the electrical properties, and the solar cell characteristics. These correlations are necessary for establishing the concentrations that can be tolerated in the silicon single crystals without degrading the solar cell performance.

Since a diamond lattice, such as silicon, is very open, atomic diffusion is considerably easier than in close-packed lattice structures. If there is a distribution of a particular impurity between the interstitial and substitutional sites, the effective diffusion coefficient is given by a weighted combination of the two individual diffusion coefficients $D_i$ and $D_s$:

$$D_{eff} = D_i f + D_s (1-f)$$

where f is a fraction in interstitial sites.

It has been proved that copper behaves in this manner by R. N. Hall and H. J. Racette, "Diffusion and Solubility of Copper in Extrinsic and Intrinsic Ge, Si and GaAs," J. Appl. Phys, vol. 35(2), 379, 1964, making precipitation or gettering an easy matter. Copper is reported to diffuse interstitially as an electrically active single charged positive ion (donor). Interstitial copper ions combine with vacancies in the silicon lattice to create a substitutional impurity. Substitutional copper has been identified as a triple acceptor in silicon crystals. (See Hall and Racette, supra.) Substitutional impurities are relatively immobile, and consequently, the effective diffusion rate of the impurity is determined by the relative abundance of the interstitial or substitutional species. Furthermore, the migration of impurities depend strongly upon the imperfection of the host silicon crystal, i.e. presence of vacancies.

Using electron spin Resonance (ESR) measurements, titanium was found to have diffused interstitially in silicon. Also, titanium is known to have a high affinity to react with oxygen and form a wide range of titanium oxides. (See Metals Handbook volume I on "Titanium and Titanium Alloys," pp. 1147-1153, 8th Edition, American Society for Metal, 1961.) Therefore, there is a great tendency for the titanium to react with the oxygen in the Czochralski grown crystal (during growth or annealing) and form interstitial oxides.

For a device such as the solar cell, the quality of the p-n junction is intimately related to the structural perfection of the junction depletion region. Crystal growth and device processing steps, both introduce in the silicon, structural imperfections such as precipitates and dislocations during the diffusion process (strain effects caused by the diffusing species) and oxide precipitate associated with the strain effects. The structural imperfections provide traps capable of storing and immobilizing the electrical charges. Accordingly, degradation of the electrical behavior of the solar cells might occur. The type of adverse electrical behavior is determined by the type, the size, and the distribution of defects. According to W. Shockley, "The Theory of P-n Junctions in Semiconductors and P-n Junctions," Bell Syst. Tech. J, Vol. 28, p. 435, 1949, metal precipitates in the space charge region are expected to produce soft junction characteristics since they are conducting.

Basically, those defects affect the electrical behavior of a diode in the following ways:

(a) Decrease the reverse voltage.
(b) Increase the reverse current.
(c) Cause forward or reverse tunneling.
(d) Decrease the minority carrier lifetime.
(e) In the case of solar cells, decrease the power output and fill factor and degrade the cell efficiency.

The silicon wafers and cells subjected to evaluation tests were 0.025 cm thick, and $1 \times 2$ cm$^2$ in size. The wafers were cut from ingots of diameter 3.12 cm prepared by Czochralski techniques with $<111>$ growth axis. The impurities (Cu, Ti) were added to the ingots during the melting process at 1412° C. Some of these wafers were characterized as received and then characterized after phosphorous diffusion. Solar cells ($1 \times 2$ cm$^2$ cells) fabricated from this material were evaluated electrically and microscopically using charge collection microscopy.

In order to investigate the effect of the defects associated with the deliberately added impurities (Cu, Ti and Cu/Ti), nondestructive experiments were performed on the as-grown wafers and after the phosphorous diffusion. Another set of experiments was performed on the finished solar cells to determine the perfection of the junction.

By comparing the results of the two sets of experiments (before and after processing), it is possible to track the critical step for the defect generation and define the defect that causes the junction degradation.

SUMMARY OF THE INVENTION

Solar cells manufactured from p-type single-crystal silicon are found to have conversion efficiencies that have been degraded to ~61% by the presence of titanium impurities in concentrations as high as $10^{15}$ atoms/cm$^3$. Adding copper to approximately the same concentration level of the titanium during the melting process, will restore the conversion efficiency to about 99.3% of what it would have been if the single-crystal silicon had been grown free of titanium impurities. This provides an inexpensive technique for preparing solar grade silicon having titanium impurities for use in the fabrication of solar cells, thus saving the cost of having to use higher grade silicon that is free of titanium impurities.

DESCRIPTION OF PREFERRED EMBODIMENTS

Figure 1:
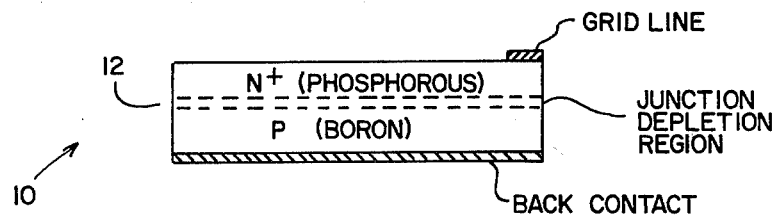
FIG. 1 illustrates an end view of an N/P solar cell fabricated from a Czochralski grown wafer, where the grid line and the back contact are deposited by convention metallization techniques.

The ingots used in this work were prepared by Czochralski techniques with <111> growth axis. The impurities (Cu, Ti) were added to the ingots during the melting process at 1412° C. The seed silicon material was boron-doped (p-type) to a concentration of ~$10^{16}$ atoms/cm$^3$. Phosphorous was diffused at ~900° C. for 30 minutes using standard space techniques into the p-type silicon wafers cut from the ingots, to form the N/P structure 10 with an n-p junction depletion region 12 as shown in FIG. 1. The concentration of phosphorous was ~$10^{20}$ atoms/cm$^3$.

Figure 2:
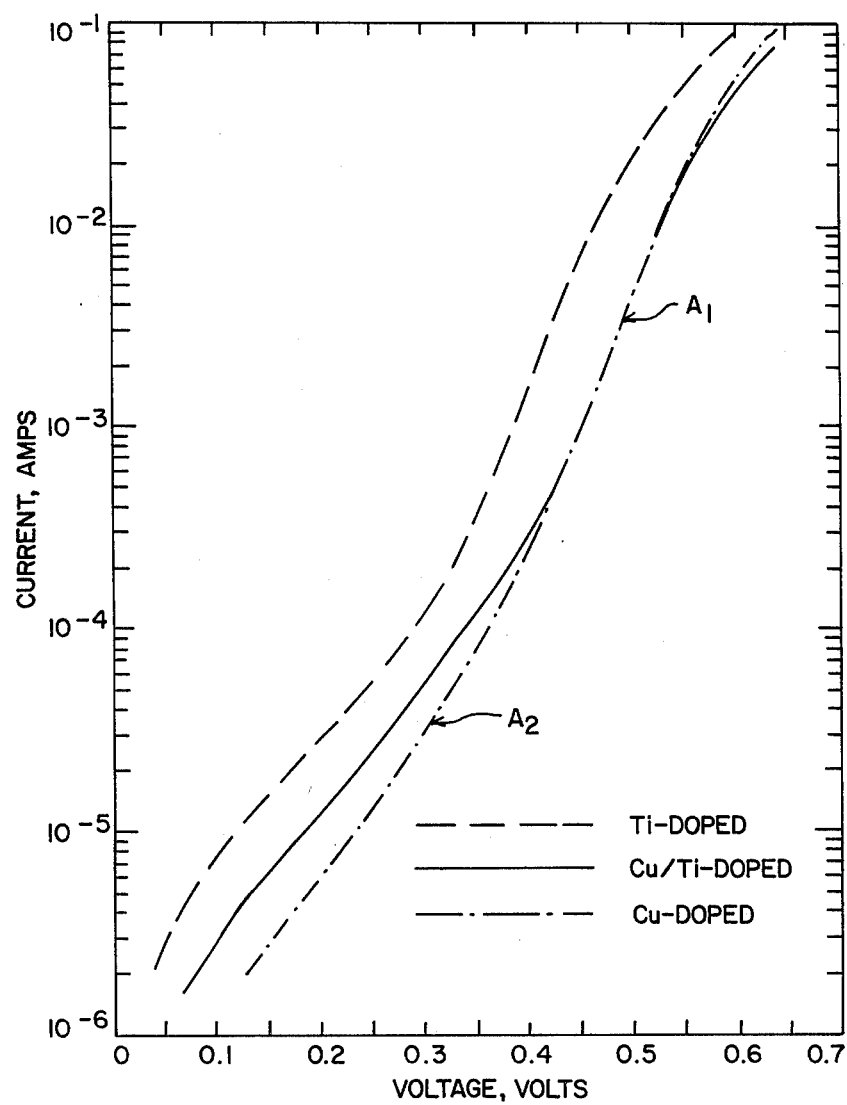
FIG. 2 illustrates the dark forward I-V curves for Cu, Ti and Cu/Ti doped silicon solar cells.

The dark forward I-V characteristic for Cu/Ti-doped silicon solar cells is shown by a solid line in FIG. 2 for comparison with the I-V characteristic of Ti-doped (dash line) and Cu-doped (dot-dash line) silicon solar cells. That and other types of evaluation tests indicates that copper mitigates at least part of the unfavorable effects of titanium, thus providing an economical way of preparing silicon material for use in solar cells when the material will have titanium impurities at a level of concentration as high as $10^{15}$ atoms/cm$^3$. The technique is to add copper in the melt during the crystal growth process to approximately the same level of concentration. The types of evaluation referred to will now be described. For more complete reporting of evaluations, see A. M. Salama, "The Effects of Copper and Titanium on Solar Cells", Proceedings of Thirteenth IEEE Photovoltaic Specialists Conference, June 5-8, 1978, Washington, D.C.

Microstructural Evaluation of the Silicon Wafers

The (111) wafers of <111> crystal orientation were examined using the nondestructive Lang transmission X-ray method. The bright spots in the Cu-doped wafers observed are precipitates present in the Cu-doped wafers of density $2.2 \times 10^3$ particles/cm$^2$ and of dislocation density of about $1.7 \times 10^3$ d/cm$^2$. The Ti-doped wafers had a higher dislocation density of ~$2 \times 10^4$ d/cm$^2$. The Cu/Ti-doped wafers had precipitate density of $10^2$ particles/cm$^2$ and dislocation density of $1.5 \times 10^3$ d/cm$^2$.

The same wafers that were examined as just described were processed for p-n junction formation by phosphorous diffusion. The back sides of those wafers were etched off as done for standard solar cell fabrication. Then they were examined by the nondestructive transmission X-ray technique. A transmission X-ray topograph of the Cu-doped wafer indicates that the precipitates increased in size, and new precipitates were observed in the central part of the wafer. A transmission X-ray topograph of the Ti-doped wafer shows significant changes in structure and the appearance of large precipitate particles in the central part of the wafer. These particles were not present before the diffusion process. A transmission X-ray topograph of the Cu/Ti-doped wafer, shows that the precipitate density has increased significantly to ~$10^3$ particles/cm$^2$, and the dislocation density decreased slightly.

Thin foils of Cu-doped, Ti-doped and Cu/Ti-doped P-diffused wafers were prepared for examination by transmission electron microscopy. It was found that β-CuSi precipitates were formed in the Cu-doped wafers. Also, β-crystoballite (SiO$_2$) particles were detected. In the Ti-doped wafers, TiO$_2$ (anatase) precipitates were detected in the central part of the wafers. The Cu/Ti-doped wafers had precipitates suspected to be a complex compound of Cu Si/Ti/O, which has not yet been fully identified.

Physical and Electrical Evaluation of the Solar Cells

Scanning electron microscopy (SEM) using the electron beam induced conductivity (EBIC) mode was employed on solar cells incorporating the dopant impurities of interest.

This nondestructive technique is useful for examining the electrically active microstructural defects in the junction depletion region. In the EBIC mode, a focused electron beam is scanned on the surface of the diffused p-n junction. Directly under the focused electron beam spot, electron-hole pairs are generated within a volume defined by the range of the electrons at the particular beam energy. In the range of 3-30 keV operating voltage, the penetration depth of the electrons in silicon is approximately 0.2-12 μm as calibrated for the SEM in use.

When the solar cell contains structural defects such as dislocations/precipitates or stacking faults within or near the p-n junction, localized charge carrier recombination occurs, thus revealing the structural defects of the solar cell in the display. In the present case, an operating voltage of 20 keV was selected for the electrons to penetrate through the Ta$_2$O$_5$ coating to the depth of the junction depletion region. The width of this region was ~0.5 μm, and the junction depth was ~0.4 μm.

No electrically active precipitates or defects were detected in the Cu-doped and Cu/Ti-doped solar cells. However, two out of five of the Ti-doped solar cells exhibited some defects on the surface and in the depletion region. It is believed that these defects are the TiO$_2$ precipitates found by TEM in the previous experiments.

Dark forward and reverse biased I-V measurements were performed on five of each of the impurity-doped cell groups under investigation. Illuminated I-V measurements were done under air mass zero (AMO) conditions. The results were then correlated with the electrically active structural defects observed from SEM experiments. Also, the dark reverse I-V characteristics were correlated with those defects in terms of current leakages or voltage decreases. Silicon solar cells fabricated from the baseline material (undoped silicon) were used for this purpose. The results of the illuminated solar cell I-V measurements were summarized in the following table:

| Cell ID No | $I_{SC}$ mA | $V_{OC}$ mV | $I_{mp}$ mA | $V_{mP}$ mV | $P_{max}$ mW | % EFF. | F.F. |
|---|---|---|---|---|---|---|---|
| B-1 | 65.5 | 574 | 61.8 | 485 | 30.07 | 11.07 | 0.797 |
| B-5 | 66.6 | 575 | 62.9 | 485 | 30.51 | 11.27 | 0.811 |
| B-6 | 66.6 | 574 | 63.1 | 485 | 30.60 | 11.30 | 0.800 |
| B-7 | 66.4 | 575 | 62.4 | 485 | 30.26 | 11.2 | 0.798 |
| Cu-1 | 66.6 | 577 | 62.5 | 485 | 30.3 | 11.2 | 0.789 |
| Cu-3 | 67.8 | 574 | 63.8 | 490 | 31.8 | 11.75 | 0.803 |
| Cu-4 | 64.1 | 573 | 60.6 | 485 | 29.4 | 10.86 | 0.80 |
| Cu-11 | 66.0 | 577 | 62.3 | 490 | 30.5 | 11.27 | 0.80 |
| Cu-12 | 65.8 | 575 | 61.5 | 485 | 29.8 | 11.01 | 0.788 |
| Ti-9 | 45.0 | 526 | 42.0 | 440 | 18.5 | 6.8 | 0.78 |
| Ti-10 | 45.6 | 527 | 42.6 | 440 | 18.7 | 6.9 | 0.78 |
| Ti-11 | 45.5 | 526 | 42.7 | 435 | 18.6 | 6.9 | 0.776 |
| Ti-12 | 46.0 | 526 | 42.8 | 440 | 18.8 | 6.94 | 0.778 |
| Ti-13 | 45.0 | 526 | 43.2 | 435 | 18.8 | 6.94 | 0.781 |
| Cu/Ti-8 | 64.5 | 572 | 59.9 | 490 | 29.4 | 10.85 | 0.796 |
| Cu/Ti-9 | 67.3 | 571 | 62.6 | 485 | 30.4 | 10.86 | 0.80 |
| Cu/Ti-11 | 67.4 | 574 | 62.4 | 490 | 30.6 | 11.30 | 0.79 |
| Cu/Ti-12 | 67.0 | 573 | 62.5 | 490 | 30.6 | 11.30 | 0.79 |
| Cu/Ti-13 | 67.2 | 574 | 63.4 | 485 | 30.7 | 11.34 | 0.797 |

As seen from this table, the Cu-doped solar cells of concentration level $\sim 10^{16}$ atoms/cm$^3$ had as high conversion efficiencies as the baseline (undoped) solar cells (average $\sim 11.2\%$). Titanium of concentration level $10^{14}$ atoms/cm$^3$ had a detrimental effect on the solar cell efficiencies, decreasing these efficiencies to $\sim 61\%$ of the baseline cell efficiencies. When copper and titanium are present in the solar cell, copper mitigated the unfavorable effect of titanium. From Table 1, the Cu/Ti-doped solar cells had conversion efficiencies of 99.3% of the baseline cell efficiencies.

The fill factor (F.F.) of the Cu-doped solar cells did not change from that of the baseline solar cells in spite of the fact that there are copper precipitates in the bulk of the solar cell. The Ti-doped cells had a lower fill factor which can be due to low shunt resistances. The fill factor of Cu/Ti-doped cells which was slightly lower than that for baseline cells can be explained by either higher values of A (the diode I-V perfection factor), high series resistance, or low shunt resistance. This will be verified later from the dark forward I-V characteristics.

When analyzing the dark forward and reverse biased I-V curves, it was found that the Cu-doped solar cells had $A_1$ and $A_2$ values of 1.4 and 2.05, where $A_1$ and $A_2$ are the diode I-V perfection factors at higher and lower voltages, respectively, obtained from the slopes of the exponential curves shown in FIG. 2. The slight deviation of the $A_1$ values from the ideal value of 1.0 may be due to some slight recombination of the electrical charges due to the gettering of the impurities toward the surface. The Ti-doped solar cells had $A_1$ and $A_2$ values of 1.2 and 1.7 respectively. Cell 11 exhibited the lowest value of $A_2$ compared to the ideal value of 2.0. It was also observed that this cell had active structural defects and precipitates in the junction depletion region. The presence of these defects which caused leakage in the junction region explains the low value of $A_2$. All Ti-doped solar cells had low shunt resistances. For the Cu/Ti-doped solar cells, the $A_1$ and $A_2$ values were 1.1 and 2.0 which are near ideal values for undoped silicon solar cells. In summary, there were slight recombination effects in the Cu-doped cells due to the presence of precipitates near the surface of the cells (in N$^+$ region); there were active defects in the Ti-doped solar cells depletion region acting as traps for the electrical charges; and the Cu/Ti-doped silicon solar cells exhibited very good junction properties. It is noteworthy that the concentration of copper in the Cu-Ti doped cells was lower than that for the Cu-doped cells alone. The titanium concentration in those Cu/Ti-doped cells however was higher than for the Ti-doped cells, emphasizing the mitigating effect of copper on titanium. FIG. 2 shows typical dark forward I-V curves for Cu-doped, Ti-doped and Cu/Ti-doped silicon solar cells as indicated. The dark reverse I-V measurements for the Ti-doped solar cells were difficult to obtain since the reverse voltage drastically dropped to near zero.

DISCUSSION

The Effect of Copper in Silicon Solar Cells

Copper has a high solubility and diffusivity in silicon. It diffuses in silicon interstitially. In the presence of high saturation of vacancies, interstitial copper ions combine with vacancies to create substitutional impurities. Substitutional copper is relatively immobile. During the Czochralski crystal growth and the rapid cooling rate of the crystal when pulled out, supersaturation occurs, and copper precipitates in the bulk of the crystals. It was found that SiO$_2$ precipitates act as nucleation centers for the copper silicide precipitates in the copper-doped wafers and cells. During the phosphorous diffusion process for forming the p-n junction of the solar cell, copper diffuses to the phosphorous region of the junction. The gettering mechanism for phosphorous diffusion was attributed to the solubility enhancement and ion pairing of substitutional metal acceptors such as copper. The X-ray topography and the transmission electron microscopy results give evidence to the precipitation of copper silicide and SiO$_2$ in the bulk of the copper-doped silicon wafers and solar cell devices. The SEM/EBIC and the dark forward I-V results prove that there are no electrically active defects in the junction depletion region and that copper diffused to the phosphorous side of the junction thereby causing slight recombination effects on the surface.

The Effect of Titanium in Silicon Solar Cells

Titanium diffuses in silicon interstitially. In the presence of a high concentration of oxygen of $\sim 7.8 \times 10^{17}$ atoms/cm$^3$ in the Czochralski crystals, it reacts very rapidly with oxygen forming a titanium oxide TiO$_2$. This TiO$_2$ being in interstitial positions in silicon is electrically active (donor). If TiO$_2$ precipitates out in silicon and if the precipitates' molar volume is greater than the molar volume of the matrix as in the case for TiO$_2$, vacancies are annihilated around the precipitated phase. Therefore, interstitials or dislocations are introduced to relax the stress field which will develop. When copper is present in high concentration, the stress might be relaxed more easily by copper diffusion towards the phosphorous region. The X-ray topography and transmission electron microscopy results indicated that TiO$_2$ precipitates were present. However, there was a considerable high density of dislocations. It is known that impurities segregate to the dislocations. If the interstitial impurities act as donors (n-type), this means that a p-n junction forms around each dislocation therefore interfering with the solar cell junction and degrading its quality.

The Effect of Copper and Titanium in Silicon Solar Cells

Since copper is a faster diffusant in silicon than titanium, it plays an important role in silicon when present with titanium. As was mentioned above, when copper is present in high concentration, the stress induced by interstitial impurities is easily relaxed by copper diffusion towards the strained region. As was found from X-ray topography and TEM, some precipitates are formed after the P-diffusion. These precipitates are believed to be a complex compound of Cu, Si, Ti and O. From the dark I-V characteristics of the corresponding solar cells, neither recombination effects, as in case of copper alone, nor compensation effects, as in case of titanium alone, were detected. The junction properties were similar to those of the undoped silicon solar cells.

CONCLUSION

The above results and discussions show that copper in a concentration of $\sim 10^{16}$ atoms/cm$^3$ causes slight surface recombination effects in solar cells, but it can be tolerated in silicon solar cells to concentrations $\leq 10^{16}$ atoms/cm$^3$. Titanium can be tolerated in silicon solar cells to concentrations $\leq 10^{14}$ atoms/cm$^3$ only if copper is present in high concentration in the matrix. Titanium alone in concentration of $10^{14}$ atoms/cm$^3$ is detrimental to the solar cells since it forms interstitial titanium oxide (anatase). Not only does TiO$_2$ act as a donor in the solar cell produced from p-type material by phosphorous diffusion, but it also introduces more dislocations and interstitials in the lattice, thus forming localized p-n junctions around dislocations and interfering with the actual cell junction. When copper is present in high concentration, the stress caused by the P-diffusion are relaxed more easily by copper diffusion towards the phosphorous region (N$^+$ region). When copper precipitates out in the form of a Cu/Si/Ti/O complex, it leaves no electrically active impurities to compensate within the junction. The reason for this behavior of copper in silicon is that copper is a fast diffusant in silicon and phosphorous thus can be gettered easily from the shallow junction region during the solar cell fabrication.

What is claimed is:

1. In the Czochralski single crystal growth process of silicon to be used for solar cells, wherein a known concentration of titanium impurities is present, the technique of adding to the silicon melt copper of at least the same concentration but not greater than $10^{16}$ atoms/cm$^3$, for mitigating the deleterious effects of the titanium impurities when the silicon crystal grown is used for solar cells.

2. A method as defined in claim 1 wherein said titanium impurities are present at a level of $10^{15}$ atoms/cm$^3$ or less, and copper at a level of $10^{15}$ atoms/cm$^3$.

* * * * *